United States Patent
Baker et al.

(10) Patent No.: US 10,807,109 B2
(45) Date of Patent: Oct. 20, 2020

(54) DEPOSITION OF PARTICLES AT DESIRED LOCATIONS USING PLASMONIC ENHANCEMENT

(71) Applicant: U.S. Army Research Laboratory ATTN: RDRL-LOC-I, Adelphi, MD (US)

(72) Inventors: David R. Baker, Alexandria, VA (US); Joshua P. McClure, Alexandria, VA (US); Kyle N. Grew, Elkridge, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 276 days.

(21) Appl. No.: 15/846,257

(22) Filed: Dec. 19, 2017

(65) Prior Publication Data
US 2019/0184413 A1    Jun. 20, 2019

(51) Int. Cl.
| | | |
|---|---|---|
| C23C 16/48 | (2006.01) | |
| C23C 14/00 | (2006.01) | |
| B05D 1/38 | (2006.01) | |
| B05B 5/08 | (2006.01) | |
| G01N 21/65 | (2006.01) | |
| H01L 27/144 | (2006.01) | |
| G03F 7/00 | (2006.01) | |

(52) U.S. Cl.
CPC ............... *B05B 5/088* (2013.01); *B05D 1/38* (2013.01); *C23C 14/00* (2013.01); *C23C 16/48* (2013.01); *G01N 21/658* (2013.01); *H01L 27/1446* (2013.01); *G03F 7/0002* (2013.01)

(58) Field of Classification Search
CPC ....... C23C 18/14; C23C 18/143; B05B 5/088; B05D 1/38; G01N 21/658; H01L 27/14446; G03F 7/0002
See application file for complete search history.

(56) References Cited

U.S. PATENT DOCUMENTS

| | | | | |
|---|---|---|---|---|
| 8,167,972 B2* | 5/2012 | Ito | ........................... | B01J 19/121 75/345 |
| 2010/0248297 A1* | 9/2010 | Hwu | ...................... | B22F 1/0022 435/34 |
| 2019/0178801 A1* | 6/2019 | Wei | ......................... | B82Y 20/00 |

OTHER PUBLICATIONS

Qiu et al; Surface Plasmon Mediated Chemical Solution Deposition of Gold Nanoparticles on a Nanostructured Silver Surface at Room Temperature; Journal of the American Chemical Society, vol. 135, Issue 1, pp. 38-41; Published: Dec. 16, 2012. (Year: 2012).*

* cited by examiner

*Primary Examiner* — Michael P Wieczorek
(74) *Attorney, Agent, or Firm* — Emily Christine Moscati

(57) ABSTRACT

Plasmonically enhanced electric fields are used to deposit particles at selected locations through decomposition or electron transfer reactions with precursor molecules in gas or liquid phase. The location of the enhanced electric fields is controlled through a combination of plasmonic substrate structure shape, material, incident light wavelength and polarization. The particles are deposited at designated locations only, whereby no deposition occurs at locations lacking enhanced electric fields. Many reaction variables can be used to change the rate of particle deposition such as precursor molecules, exposure time, precursor concentration, and temperature making for a highly customizable reaction space.

11 Claims, 3 Drawing Sheets

```
30 ──► ┌─────────────────────────────────────┐
       │  PROVIDING A PLASMONICALLY ACTIVE   │
       │  MATERIAL COMPRISING A REGION       │──31
       │  COMPRISING A PLASMONICALLY         │
       │  ENHANCED ELECTRIC FIELD.           │
       └─────────────────────────────────────┘
                         │
                         ▼
       ┌─────────────────────────────────────┐
       │  SIMULTANEOUSLY INTRODUCING A LIGHT  │
       │  BEAM AND APPLYING A PRECURSOR       │
       │  MOLECULE TO THE PLASMONICALLY       │──32
       │  ACTIVE MATERIAL CAUSING PARTICLE    │
       │  DEPOSITION ON THE PLASMONICALLY     │
       │  ACTIVE MATERIAL .                   │
       └─────────────────────────────────────┘
```

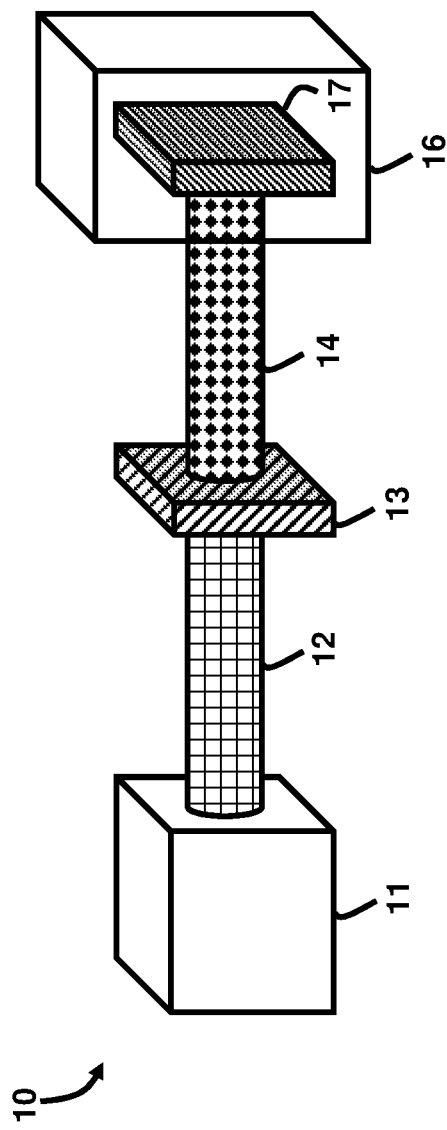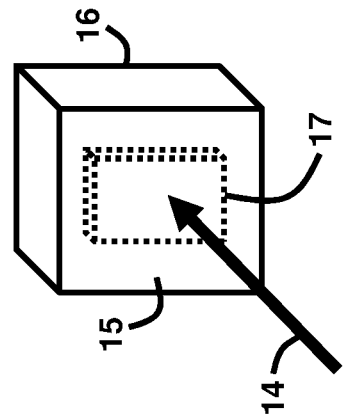
FIG. 1A
FIG. 1B

DEPOSITION OF PARTICLES AT DESIRED LOCATIONS USING PLASMONIC ENHANCEMENT

GOVERNMENT INTEREST

The embodiments described herein may be manufactured, used, and/or licensed by or for the United States Government without the payment of royalties thereon.

BACKGROUND

Technical Field

The embodiments herein generally relate to photodeposition techniques, and more particularly to a photodeposition technique using plasmonics.

Description of the Related Art

Photodeposition of particles has been a common practice for over a century. In lithography processes, selective area deposition uses photomasks and polymers to physically block sites from unwanted deposition. When these are removed the deposited material is what remains. Accordingly, to decorate surfaces with particles in a lithography process they either have to be deposited as part of an indiscriminate deposition followed by a lift-off of a patterned photoresist underlayer, or the surface must be functionalized with tag molecules which target sites of interest such as used in biological applications.

SUMMARY

In view of the foregoing, an embodiment herein provides a method of particle deposition, the method comprising providing a plasmonically active material comprising a region comprising a plasmonically enhanced electric field; and simultaneously introducing a light beam and applying a precursor molecule to the plasmonically active material causing particle deposition on the plasmonically active material. The precursor molecule in the region comprising the plasmonically enhanced electric field may decompose with the introduction of the light beam thereon. The method may comprise suspending the plasmonically active material in a liquid solution. The particle deposition may occur by decomposition of the precursor molecule. The particle deposition may occur by an electron transfer reaction between the precursor molecule and the plasmonically active material.

The precursor molecule may be dissolved in a liquid solvent and then applied to the plasmonically active material. The precursor molecule may comprise a gas. The method may comprise providing a substrate to hold the plasmonically active material; and fabricating a shape of the substrate prior to simultaneously introducing the light beam and applying the precursor molecule to the plasmonically active material. The method may comprise altering any of a wavelength and polarization of the light beam. The method may comprise changing a rate of particle deposition. The method may comprise repeating simultaneously introducing the light beam and applying the precursor molecule to the plasmonically active material causing additional particle deposition on the plasmonically active material.

Another embodiment provides a system of particle deposition, the system comprising a plasmonically active material comprising a region comprising a plasmonically enhanced electric field and a precursor molecule; and a light source to introduce a light beam at a same time as the precursor molecule is applied to the plasmonically active material causing particle deposition on the plasmonically active material. The precursor molecule in the region may comprise the plasmonically enhanced electric field decomposes with the introduction of the light beam thereon. The precursor molecule may be suspended in a liquid solution. The particle deposition may occur by decomposition of the precursor molecule. The particle deposition may occur by an electron transfer reaction between the precursor molecule and the plasmonically active material. The system may comprise a liquid solvent containing the precursor molecule dissolved therein. The precursor molecule may comprise a gas. The system may comprise a light modification element that modifies the light beam prior to hitting the plasmonically active material. The light modification element may be configured to alter any of a wavelength of the light beam; and a polarization of the light beam.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1A is a schematic diagram illustrating a system, according to an embodiment herein;

FIG. 1B is a schematic diagram illustrating a reactor vessel of the system of FIG. 1A, according to an embodiment herein;

DETAILED DESCRIPTION

Figure 2:
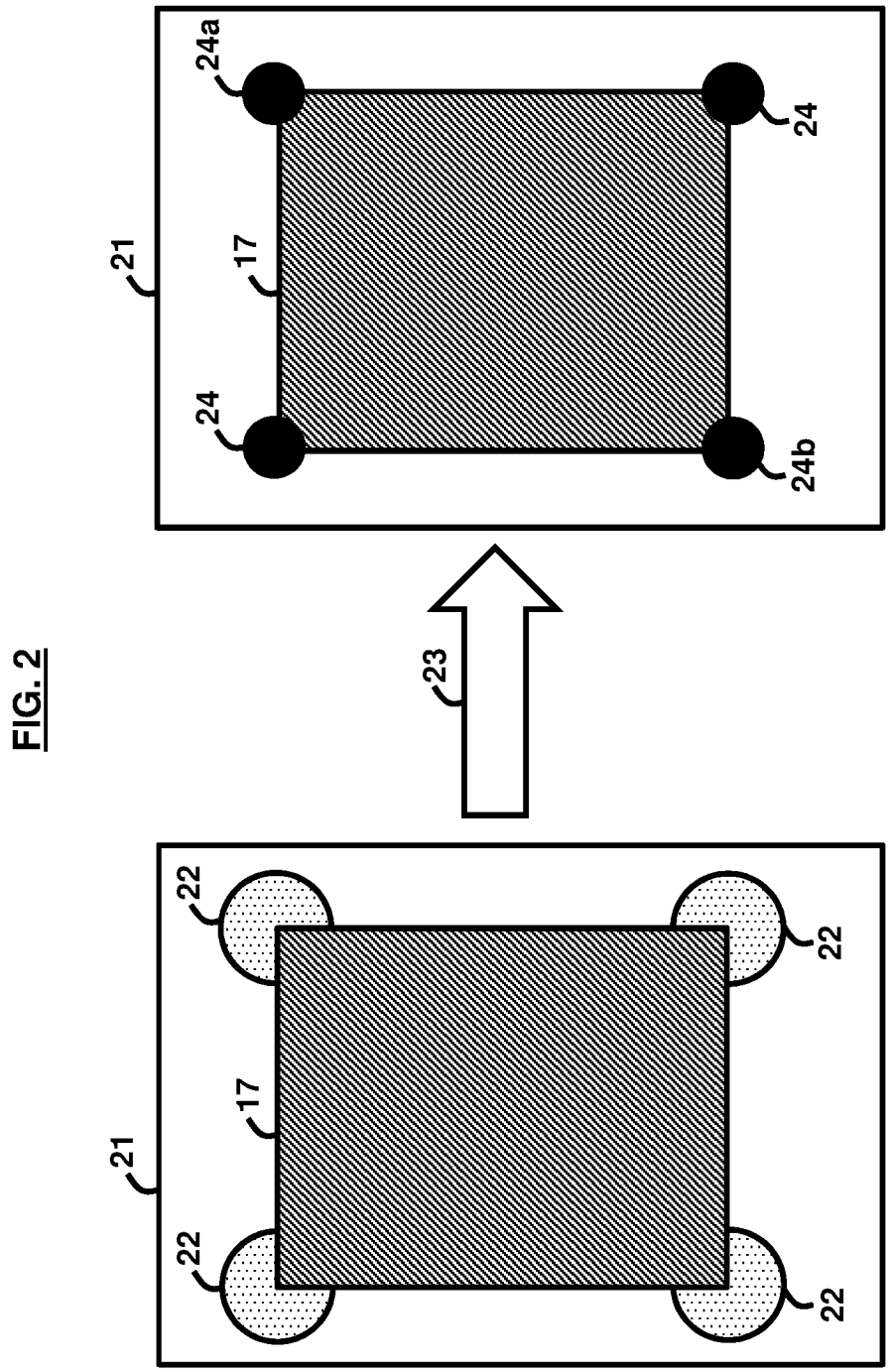
FIG. 2 is a schematic diagram illustrating plasmonic hot-spots acting as reaction sites resulting in particle deposition, according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a plasmonically active substrate that is used to deposit particles at selected locations determined by controlling the location of plasmonic electric field amplification. The location of the plasmonic "hot-spots" may be tuned to selective positions with the modification of structure shape, material, wavelength of incident light, and polarization of incident light. As described herein, the term "hot-spots" refers to a localized region of a structure, such as a substrate, having an amplified electric field. The precursor molecules for particle deposition can be dissolved in liquid solvent or in gaseous form.

The embodiments herein may be used to deposit particles at plasmonic hot-spots for photochemistry, and has wide-ranging applications including to make nano-electronics and to be used as a nano-lithography process for semiconductor applications including being paired with atomic layer deposition gaseous precursors. The embodiments herein remove the aforementioned lift-off step and the need for massive amounts of wasted material resulting in a "greener" (i.e., less hazardous materials are needed in the process) and cheaper particle deposition process. Furthermore, no ligand or functionalization is required, which can change the properties of particles. Referring now to the drawings, and more particularly to FIGS. 1A through 3, there are shown exemplary embodiments.

The use of plasmonics may be used to facilitate chemical reactions. The plasmonic material absorbs light energy through fluctuations in free electrons and then that energy travels along the surface as a wave, called a plasmon, to the edges of the structure. At the edge of the structure the resulting electric field is amplified compared to the electric field of the original incident light resulting in a hot-spot. The strength of this electric field is dependent on the shape of the structure, such as sharp corners, or by being in close proximity to another structure similarly absorbing the incident light. Surface enhanced Raman spectroscopy (SERS), for example, may use this phenomenon to detect dilute traces of material in liquid and gas phases.

When the energy in the amplified electric field relaxes it may do so through energy transfer to the surrounding medium. This process causes the surrounding medium to rise in temperature by up to several hundred degrees. Additionally, the plasmon may relax by transferring a "hot-electron", which is an electron existing in an excited state. The hot-electron process results in excited states in the plasmonic particle followed by electron transfer to a surface bound species.

According to the embodiments herein, plasmonic structures are used to absorb light and make hot-spots, which when simultaneously exposed to precursor molecules cause the precursor molecules to decompose and form particles. The hot-spots comprise plasmonically induced electric fields. The precursor is photodeposited in selected hot-spot areas. The decomposition of the precursor molecules takes place only in the presence of the hot-spots. Since the plasmonically induced electric fields may be tuned based on shape, wavelength of light, and the polarization of light, the position at which the particles deposit may be similarly tuned and thus it can be determined beforehand where the particles will deposit.

Accordingly, the embodiments herein utilize plasmonic materials to intensely focus energy to the surface of a nanostructure to perform thermal decomposition or direct electron transfer reactions in order to specifically deposit particles in a selective area. FIG. 1A is a schematic diagram illustrating a system 10, according to an embodiment herein. The system 10 is used to form particles by directing the traveling plasmonic wave to desired sites on the plasmonic structure. The system 10 comprises a light source 11 that directs a light beam 12. In an example, the light source 11 may be a lamp or laser, either in continuous wave (CW) or with a repetition (pulsed or chopped) pattern. The wavelengths may span from approximately 250-2000 nm, in a non-exclusive example.

The size of the light beam 12 may span reasonably from a diffraction limited spot which depends on the wavelength, to approximately six inches in diameter, in a non-exclusive example. In examples, the intensity may range from approximately 1 mW/cm$^2$ to 10's of W/cm$^2$. The light beam 12 may also have a Gaussian distribution spatially or may be even across the light spot.

A light modification element 13 may be provided to adjust or modify the light beam 12 into a modified light beam 14. The light modification element 13 may comprise a filter, monochromater, or polarizer, etc., according to some examples. The modified light beam 14 may be tuned for a specific wavelength with a narrow wavelength range (e.g., approximately <1 nm) or a spectral window of 10's of nanometers, or may be left broadband. The modified light beam 14 may also have linear polarization, circular polarization, or elliptical polarization, according to various examples. The spot size, intensity, and repetition rate may all also be modified from the initial light beam 12.

The modified light beam 14 then enters a transparent widow 15 (shown in FIG. 1B) of a reactor housing 16. In an example, the reactor housing 16 comprises a particle precursor, which is a source of the material that makes up the particle that is deposited. The modified light beam 14 then hits a plasmonically active material 17 positioned in the reactor housing 16.

In some examples, the plasmonically active material 17 may comprise gold, silver, or copper that may be constructed on a substrate 21 (shown in FIG. 2). According to some examples, the substrate 21 may comprise any of silicon, glass, steel, and plastic. In another example, the plasmonically active material 17 may be suspended in solution. In various examples, the solution may comprise water, dimethyl sulfoxide (DMSO), toluene, acetonitrile, or other solvents. The suspension solution may have an effect on the plasmonic activity since the dielectric properties of the interface of the plasmonically active material 17 may determine the plasmonic properties. Since hot-spots are typically directed towards the ends of a rod, for example, or focused onto corners of a cube, the anisotropy of the material 17 directs the plasmon to the desired location. The composition of the material 17 may also be used to tune the plasmonic response of the material 17.

The incident of the light beam 12, 14 may be controlled in several ways including: wavelength, intensity, and polarization. The wavelength control approach may be used because the plasmonically active material 17 will absorb and scatter some wavelengths of light more than others. It is possible to manipulate the absorption spectrum of a material based on shape and size, therefore the wavelength of the incident light beam 12, 14 should be controlled to correspond with the plasmonically active material 17 constructed with the system 10, as described above.

The intensity of the incident light beam 12, 14 will have an impact on the rate of the deposition reaction. Incident photons are used to re-excite the plasmonically active material 17 after the energy or electron is transferred to the surrounding medium or precursor molecule 23. By controlling the photon flux, the temperature of the medium near the plasmonically active material 17 may be controlled up to a saturation limit. In an example, the temperature may be up to the melting point of the plasmonically active material 17. Similarly, the rate of reaction for an electron transfer is balanced between the diffusion rate of precursor molecules 23 and the rate at which the plasmonically active material 17 can be activated. In one example, the rate of reaction may be around $6 \times 10^4$ silver atoms/s when under 50 mW/cm$^2$ of polarized, visible light, resulting in a 5 μm silver particle in 17 h.

In another example, a 200 nm platinum particle may be formed in 2 h under similar conditions representing $4 \times 10^4$ platinum atoms deposited per second. Moreover, by controlling the reaction rate and the exposure time, the particle sizes may be controlled. The exposure time may vary from an hour to a day, for example and depending on the light conditions, it may be boosted to just a few minutes in enhanced light conditions or it could last several days if the light conditions are dim. The particle sizes may be on the micron or nanometer scale, in various examples.

By controlling the polarization of incident photons, the position of hot-spots may be controlled in the anisotropic plasmonically active material 17. Under linearly polarized light there are preferential locations for large electric fields. By orienting the plasmonically active material 17 with the known polarized light beam 12, 14, one may direct plasmons to desired areas, and therefore perform the deposition reaction in selected locations of the plasmonically active material 17.

Next, as the reaction rates are dependent on an environmental variable, the temperature and pressure of the reactor housing 16 should be maintained or controlled to meet the desired deposition rate. This is applicable for both gas phase reactions and liquid phase reactions. The temperature may be very low (e.g., approximately 4K) to the melting temperature of the plasmonically active material 17 (could be up to approximately 1000° C.). The pressure may also be in ultra-high vacuum (e.g., approximately $10^{-6}$ Pa) to high pressure reactors (e.g., approximately 10 bar or greater).

The precursor 23 to the deposited particle is used for determining the chemical composition of the resulting particle. Beyond elemental considerations, the choice of the precursor may also have an effect on the energy needed to decompose. The concentration of the precursor may also be established prior to the reaction since it will help determine the reaction rate in conjunction with other parameters, as described above. Impurities may also have an effect on the surface deposition as they may block active sites, change the plasmonic properties of the plasmonic substrate, or cause deleterious side reactions.

To deposit the particles 24 onto the plasmonically active material 17, the plasmonically active material 17 is exposed to the incident light beam 14 and the precursor molecules 23 simultaneously (either in a gas phase or in a liquid phase) as illustrated in FIG. 2. The plasmonic hot-spots 22 correspond to specific regions of the plasmonically active material 17 and act as reaction sites resulting in particle deposition. The plasmonically active material 17 and substrate 21 are exposed to illumination (e.g., modified light beam 14). While the plasmonically active material 17 is illuminated, the particular precursor 23 is introduced. The precursor 23 may comprise silver halides and chloroplatinic acid, according to some examples. The result is the deposited particle 24.

The induced electric fields, which may be induced up to $10^6$ times the normal strength at desired sites, decompose the precursor molecules 23 which deposit as particles 24 on the hot-spots 22 of the plasmonic substrate 21. Whether the light beam 14 exposes the material 17 before the precursor 23 is introduced, or if the material 17 is exposed to the precursor 23 before the light beam 14 does not affect the process. The process becomes functional only when the plasmonically active material 17 is exposed to both light 14 and the precursor 23 simultaneously.

The material 17 with the deposited particles 24 may be processed again using the method described above. Since the plasmonically active material 17 may have different modes for become active depending on the variables described above, one particle (e.g., 24a) may be deposited under one condition, and then the reaction conditions may be changed and a new particle (e.g., 24b) may be deposited at a different location and may be even of a different material, if desired.

Figure 3:
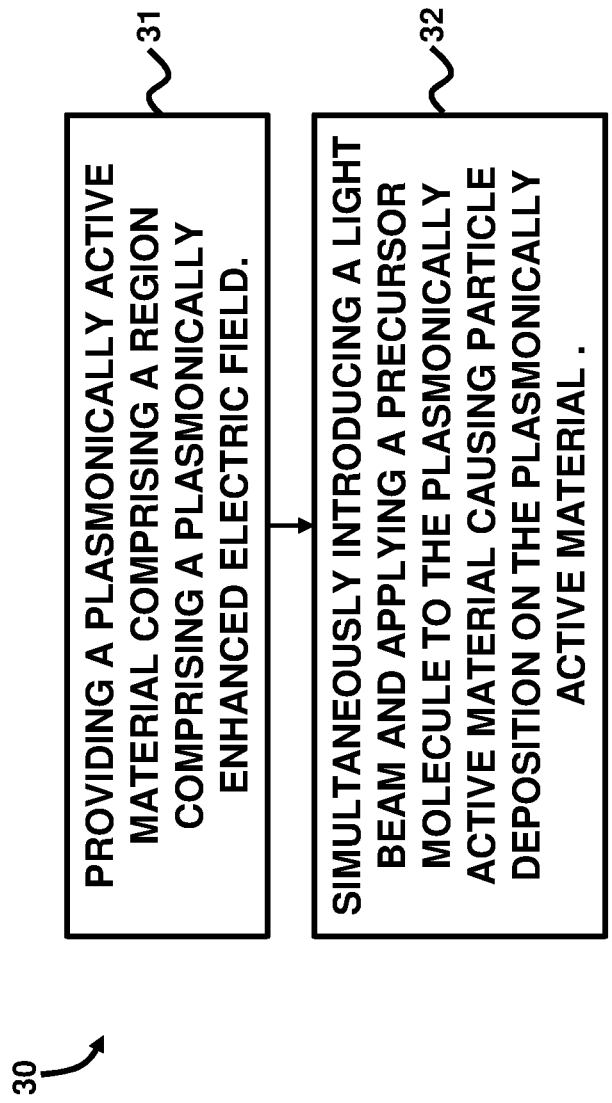
FIG. 3 is a flow diagram illustrating a method for particle deposition, according to an embodiment herein.

FIG. 3, with reference to FIGS. 1A through 2, is a flow diagram illustrating a method 30 of particle deposition, wherein the method 30 comprises providing (31) a plasmonically active material 17 comprising a region 22 comprising a plasmonically enhanced electric field; and simultaneously introducing (32) a light beam 12 and applying a precursor molecule 23 to the plasmonically active material 17 causing particle deposition on the plasmonically active material 17. The precursor molecule 23 in the region 22 comprising the plasmonically enhanced electric field decomposes with the introduction of the light beam 14 thereon. The method 30 may comprise suspending the plasmonically active material 17 in a liquid solution.

The particle deposition may occur by decomposition of the precursor molecule 23. Alternatively, the particle deposition may occur by an electron transfer reaction between the precursor molecule 23 and the plasmonically active material 17. The precursor molecule 23 may be dissolved in a liquid solvent and then applied to the plasmonically active material 17. The precursor molecule 23 may comprise a gas. The method 30 may comprise providing a substrate 21 to hold the plasmonically active material 17, and fabricating the shape of the substrate 21 prior to simultaneously introducing the light beam 14 and applying the precursor molecule 23 to the plasmonically active material 17. Some example shapes of the substrate 21 include crosses, rods, cubes, squares, triangles, as well as arrays of these shapes.

The method 30 may comprise altering a wavelength of the light beam 14. The method 30 may comprise altering a polarization of the light beam 14. The method 30 may comprise changing a rate of particle deposition. The method 30 may comprise repeating simultaneously introducing the light beam 14 and applying the precursor molecule 23 to the plasmonically active material 17 causing additional particle deposition on the plasmonically active material 17.

The embodiments herein allow for particle formation without fabricating large quantities of metal nanoparticles, such as is commonly encountered with solution based techniques. Also, the embodiments herein provide a technique for deposition that does not result in covering the target substrate 21 with particles 24, 24a, 24b in undesired locations. Specifically, the particles 24, 24a, 24b are only formed where there are enhanced electric fields, such as in hot-spot regions 22, on the plasmonically active material 17. The embodiments herein allow for the synthesis of particles 24, 24a, 24b in desired locations on the plasmonically active material 17 without chemical precursors and surface functionalization of the particle 24, 24a, 24b or the plasmonically active material 17.

The embodiments herein also avoid the use of photoresist steps commonly found in semiconductor fabrication techniques. Semiconductor structures may be used to photodeposit particles, but they tend to only have a limited ability to deposit the particles in selected locations. Accordingly, the embodiments herein have much greater control of the location and limits the amount of deposition in undesired locations which commonly occurs with conventional semiconductor photodeposition.

Furthermore, the embodiments herein may perform thermal decomposition of the precursors 23 into the particles 24, 24a, 24b at selected locations 22, which semiconductors cannot. Moreover, the method provided by the embodiments herein are useful for particles 24, 24a, 24b ranging from nanometer to micro-sizes. More specifically, the method allows precise control of nanometer-size particles, which is often difficult to produce with standard lithography techniques.

The embodiments herein may be used to develop nanoscale electronics for smaller sensor platforms and wearable electronics with low power consumption. It may also be used to create catalyst electrodes for switchable reactors to generate fuels and modify the reactions depending on desired material. Additionally, the embodiments herein may be used for new electronic material fabrication, especially on the nano-scale level, which is imperative for creating nano-circuitry while also limiting process steps.

The method may also be of use in green chemistry fabrication processes since it creates nano-particles only where needed, and not in bulk solutions, which would be discarded and thereby wasteful. The method may be used in sensing applications where select area deposition on irregular substrates with nanometer-size particles is not well established. The embodiments herein may be used to create very thin conformal coatings of materials, and may be used to lower the temperature of certain deposition processes such as atomic layer deposition that require higher temperatures for conformal coatings.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of particle deposition, the method comprising:
providing a plasmonically active material comprising a region comprising a plasmonically enhanced electric field and a region without a plasmonically enhanced electric field, the plasmonically active material comprising gold;
simultaneously introducing a light beam and applying a precursor molecule to the plasmonically active material causing particle deposition on the plasmonically active material comprising the region comprising the plasmonically enhanced electric field, the light beam comprising photons having wavelengths from 250-2000 nm; and
directing particle deposition in selected locations of the plasmonically active material comprising the region comprising the plasmonically enhanced electric field;
whereby the region of the plasmonically active material without the plasmonically enhanced electric field does not exhibit particle deposition.

2. The method of claim 1, wherein the precursor molecule in the region comprising the plasmonically enhanced electric field decomposes with the introduction of the light beam thereon.

3. The method of claim 1, wherein the particle deposition occurs by decomposition of the precursor molecule.

4. The method of claim 1, wherein the particle deposition occurs by an electron transfer reaction between the precursor molecule and the plasmonically active material.

5. The method of claim 1, wherein the precursor molecule comprises a gas.

6. The method of claim 1, comprising:
providing a substrate to hold the plasmonically active material; and
fabricating a shape of the substrate prior to simultaneously introducing the light beam and applying the precursor molecule to the plasmonically active material.

7. The method of claim 1, comprising altering any of a wavelength and polarization of the light beam.

8. The method of claim 1, comprising directing the location of particle deposition.

9. The method of claim 1, comprising repeating simultaneously introducing the light beam and applying the precursor molecule to the plasmonically active material causing additional particle deposition on the plasmonically active material.

10. The method of claim 1, comprising suspending the plasmonically active material in a liquid solution.

11. The method of claim 1, wherein the precursor molecule is dissolved in a liquid solvent and then applied to the plasmonically active material.

* * * * *